United States Patent
Brown

(10) Patent No.: US 7,525,864 B2
(45) Date of Patent: Apr. 28, 2009

(54) MEMORY DATA INVERSION ARCHITECTURE FOR MINIMIZING POWER CONSUMPTION

(75) Inventor: Jeffrey S. Brown, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 28 days.

(21) Appl. No.: 11/696,870

(22) Filed: Apr. 5, 2007

(65) Prior Publication Data
US 2008/0247257 A1 Oct. 9, 2008

(51) Int. Cl.
*G11C 5/14* (2006.01)
(52) U.S. Cl. ............. 365/227; 365/121; 365/189.15; 365/189.16; 365/203; 365/230.06
(58) Field of Classification Search ........... 365/227, 365/121, 189.15, 189.16, 203, 230.06
See application file for complete search history.

(56) References Cited

U.S. PATENT DOCUMENTS 5,559,741 A * 9/1996 Sobue .................. 365/200
2005/0018519 A1* 1/2005 Nii ...................... 365/227

* cited by examiner

*Primary Examiner*—Huan Hoang
*Assistant Examiner*—Fernando N Hidalgo
(74) *Attorney, Agent, or Firm*—Christopher P. Maiorana, PC

(57) ABSTRACT

A method for conserving power in a device is disclosed. The method generally includes the steps of (A) storing a plurality of data items in a plurality of bit cells in the device such that a majority of the bit cells holding the data items have a first logic state, wherein reading one of the bit cells having the first logic state consumes less power than reading one of the bit cells having a second logic state; (B) generating a polarity signal by analyzing the data items, the polarity signal indicating that the data items are stored in one of (i) an inverted condition and (ii) a non-inverted condition relative to a normal condition; and (C) driving at least one of the data items onto an external interface of the device in the normal condition during a read operation based on the polarity signal.

20 Claims, 8 Drawing Sheets

US 7,525,864 B2

MEMORY DATA INVERSION ARCHITECTURE FOR MINIMIZING POWER CONSUMPTION

FIELD OF THE INVENTION

The present invention relates to nonvolatile memories generally and, more particularly, to a memory data inversion architecture for minimizing power consumption.

BACKGROUND OF THE INVENTION

Power consumed by a conventional Read Only Memory (ROM) device is data dependent. Data stored in a low voltage state consumes more power than data stored in a high voltage state due to increased bitline toggling. The toggling occurs when a pre-charged bitline is discharged while reading low voltage type data and then pre-charged again as part of a subsequent read.

Unused memory locations in the ROM are often padded to high voltage type values such that when addressed, the corresponding bitlines do not discharge. As such, the power consumption in the ROM will be low when addressing the unused locations. However, the padding only considers the unused address spaces. Padding offers no benefits to the overall power consumed when reading the full ROM.

SUMMARY OF THE INVENTION

The present invention concerns a method for conserving power in a device. The method generally comprises the steps of (A) storing a plurality of data items in a plurality of bit cells in the device such that a majority of the bit cells holding the data items have a first logic state, wherein reading one of the bit cells having the first logic state consumes less power than reading one of the bit cells having a second logic state; (B) generating a polarity signal by analyzing the data items, the polarity signal indicating that the data items are stored in one of (i) an inverted condition and (ii) a non-inverted condition relative to a normal condition; and (C) driving at least one of the data items onto an external interface of the device in the normal condition during a read operation based on the polarity signal.

The objects, features and advantages of the present invention include providing a memory data inversion architecture for minimizing power consumption that may (i) reduce an average power consumption, (ii) be optimized from time to time to account for reprogrammable data sets and/or (iii) take planned data sets into consideration during fabrication.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Power consumption in memories with single ended bitcell access is data dependent. If a low voltage bit (e.g., a logical zero) is programmed into a bit cell, the bit cell generally drives a pre-charged bitline low during a read access to sense the stored data. A pre-charge module may subsequently restore the charge on the bitline prior to the next access. Due to the high capacitance on the bitlines, a significant amount of power is usually spent reading a logical zero. If a high voltage bit (e.g., a logical one) is programmed into the bit cell, the bitline generally remains charged during the read access. As such, little power to no power consumption (e.g., $\sim CV^2$) may be associated with bitline movement when reading a logical one.

The present invention generally provides a programmable data inversion/non-inversion capability within an output data path of a memory device and a decision operation that determines how to program the inversion/non-inversion capability. Where the memory data is predominantly logical zeros, the data may be inverted on a bit-by-bit basis, stored in the device in the inverted condition, and inverted during a read to restore the data to the correct (e.g., normal) condition before leaving the device. Where the memory data is predominantly logical ones, the data may be stored as-is and not inverted during the read access. As such, the bitline toggling and power consumption associated with the stored data may be minimized. The inclusion of the inverter in the data output path may be achieved either as (i) a mask programmable step (e.g., similar to ROM data programming with a last ROMcode update prior to tapeout) or (ii) a permanent module controlled by a signal.

Figure 1:
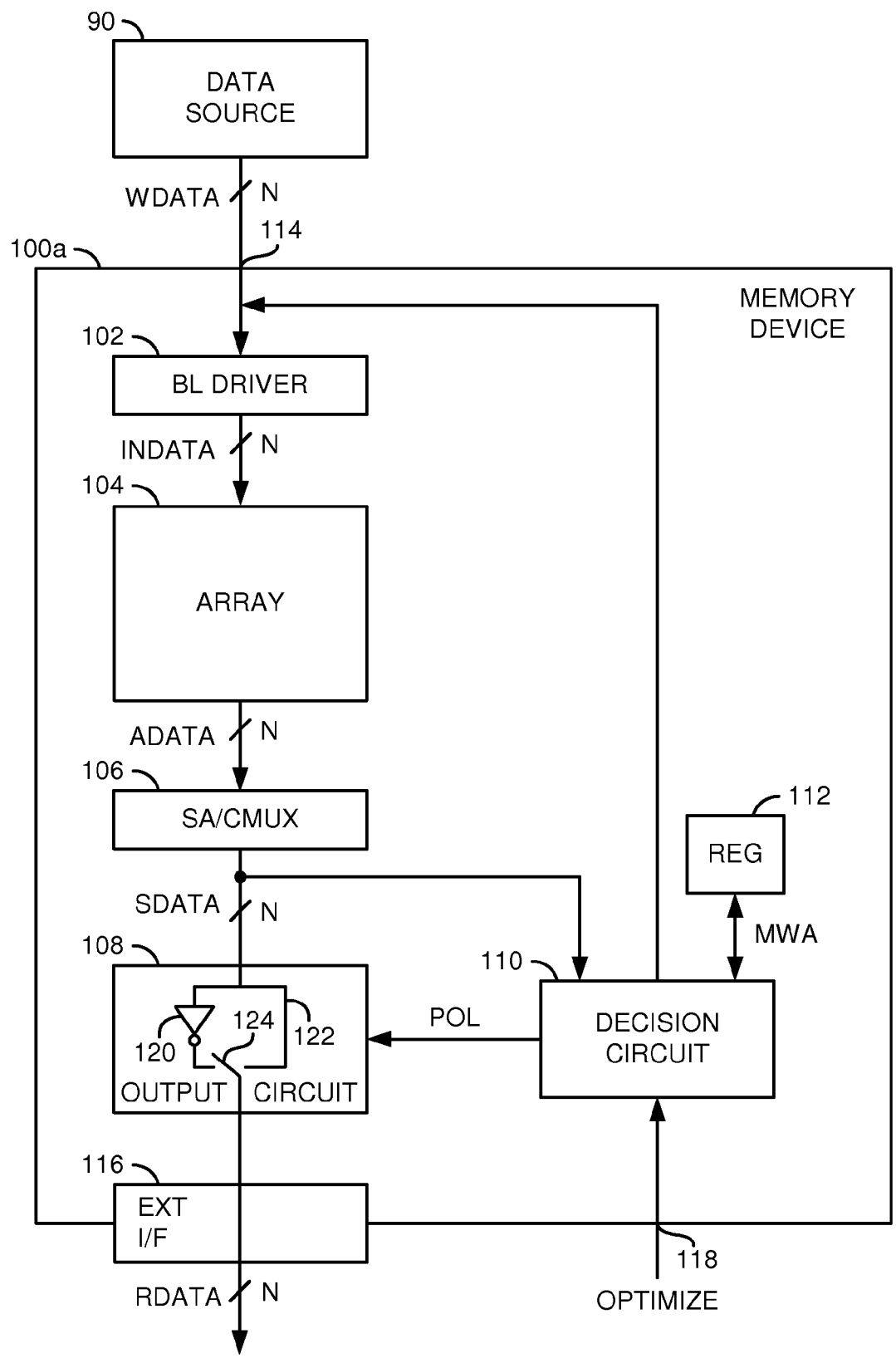
FIG. 1 is a block diagram of a first example implementation of a device in accordance with a preferred embodiment of the present invention.

Referring to FIG. 1, a block diagram of a first example implementation of a device 100a is shown in accordance with a preferred embodiment of the present invention. A data source 90 is illustrated as a source of one or more data items to be stored in the device 100a. The device 100a (or apparatus) generally comprises a circuit (or module) 102, a circuit (or module) 104, a circuit (or module) 106, a circuit (or module) 108, a circuit (or module) 110 and a circuit (or module) 112. An interface 114 may enable the device 100a to receive write data from the data source 90 via a signal (e.g., WDATA). Another interface 116 may be used to present read data from the device 100a in a signal (e.g., RDATA). An interface 118 may receive an optimization signal (e.g., OPTIMIZE). In some embodiments, the interface 114 and the interface 116 may be the same physical interface.

The signal WDATA may be received by the circuit 102. The circuit 102 may generate and present a signal (e.g., INDATA) to the circuit 104. A signal (e.g., ADATA) may transfer data items from the circuit 104 to the circuit 106. The circuit 106 may generate and present a signal (e.g., SDATA) to both the circuit 108 and the circuit 110. The circuit 108 may present the signal RDATA through the interface 116. A signal (e.g., POL) may be generated by the circuit 110 and presented to the circuit 108. The circuit 112 may exchange a signal (e.g., MWA) with the circuit 110.

The device 100a may be implemented as a one-time programmable memory device or a reprogrammable memory device. One-time programmable type devices generally include, but are not limited to, read only memory (ROM), programmable read only memory (PROM), mask programmable memory, fuse programmable memory, anti-fuse programmable memory and laser programmable memory. Reprogrammable type devices generally include, but are not limited to, erasable PROM (EPROM), electronically erasable PROM (EEPROM), ultra-violet erasable PROM (UVPROM), Flash memory, bubble memory, ferro-electric memory, dynamic random access memory (DRAM) and static random access memory (SRAM). The device 100a may be designed as a stand alone memory and/or as part of a larger circuit, such as a microcontroller.

The circuit 102 may implement a bitline driver circuit. The circuit 102 is generally operational to drive data items received from the data source 90 onto the bitlines via the signal INDATA during a write operation to transfer data items into the bit cells of the circuit 104. The circuit 102 may drive N bitlines simultaneously, where N is an integer of one or greater.

The circuit 104 may be implemented as one or more arrays of bit cells. The circuit 104 may be configured to store the data items received from the circuit 102 during write operations. During a read operation, the circuit 104 may present the addressed data items (bit cells) in the signal ADATA. Storage of the data items may be arranged in sets of N bits per addressable unit. For example, the device 100a may be designed to store data items in units of 1 bit, 8 bits, 16 bits, 32 bits or 64 bits. Other word sizes may be implemented to meet the criteria of a particular application.

The circuit 106 generally implements multiple sense amplifiers (SA) and one or more column multiplexers (CMUX). The circuit 106 may be operational to sense a change in voltage on the bitlines (e.g., signal ADATA) during read operations to determine if the addressed bit cells contain logical one data or logical zero data. The circuit 106 may also be operational to multiplex data received in the addressed columns into the signal SDATA.

The circuit 108 may implement an output circuit. The circuit 108 is generally configured to generate the signal RDATA at the interface 116 by buffering the signal SDATA. The buffering may be selectively inverting or non-inverting as determined by a polarity command received in the signal POL. Where the signal POL commands an inversion, the circuit 108 may invert each individual bit in the signal SDATA to create the corresponding bits in the signal RDATA. Where the signal POL commands a non-inverting transfer, the circuit 108 may transfer each individual bit of the signal SDATA to the corresponding bit in the signal RDATA without altering the logic states.

The circuit 108 may be implemented by a variety of designs. For example, the circuit 108 may comprise an inverter 120, a non-inverting path 122 and a switch 124 for each of the N bits in the signal SDATA. The switch 124 may be controlled by the signal POL to generate the signal RDATA from the inverter 120 or the non-inverting path 122. In ROM type designs, the switch 124 may be eliminated if the data set is known before fabrication of the device 100a is finished. In such a case, the final tapeout of the device 100a may include only one of the inverter 120 or the non-inverting path 122 in the final design. In other designs, the circuit 108 may comprise a two-input exclusive OR gate for each bit, where one of the inputs receives the signal POL. Other designs may be implemented to meet the criteria of a particular application.

The circuit 110 may implement a decision circuit. The circuit 110 is generally operational to generate the signal POL based on the data items stored in the circuit 104. Once all of the data items have been loaded into the circuit 104, the circuit 110 may read each data item, count the total number of logical one bits and the total number of logical zero bits, then generate the signal POL accordingly. The following considers a case where the circuit 104 incorporates bitlines that are charged to a high voltage at the start of a read operation. The circuit 110 may generate the signal POL in (i) a non-inverting condition if a majority of the data items stored in the circuit 104 have the logical one (e.g., high voltage) state and (ii) an inverting condition if the majority of the data items have the logical zero (e.g., low voltage) state.

If the circuit 110 concludes that the majority of the data items are in the logical zero state, the circuit 110 may walk through the data items a second time performing a read-invert-write operation to change the majority from the logical zero state to the logical one state. Each data item may be read by the circuit 110 via the signal SDATA, inverted, and presented to the circuit 102 via the signal WDATA. The circuit 102 may write the inverted data item back into the circuit 104 and the process repeated with the next data item.

The circuit 112 may be implemented as an optional register. The circuit 112 generally stores a maximum write address that identifies a boundary between the written data items and unused bit cells set to a default logical state. The circuit 112 may be useful in situations where the data items occupy a fraction of the total capacity of the circuit 104. The circuit 110 may use the maximum write address (e.g., the signal MWA) to limit (i) the initial scan of the circuit 104 to the bit cells holding actual data and (ii) the read-invert-write pass through the circuit 104 to leave the unused bit cells in the default state (e.g., the power saving logical one state). In some situations where the data items fill virtually the entire circuit 104, the circuit 112 may be eliminated leaving the circuit 110 to treat all bit cells as if holding valid data.

By configuring the data items to be stored in predominantly the logical one state, the average $CV^2$ power consumed by the bitlines may be minimized. The average power savings may be most beneficial in larger memory arrays and/or frequently read memory arrays. In designs where the circuit 104 precharges the bitlines to the logical zero state, the circuit 110 may be configured to establish the majority of data items in the logical zero state to minimize power consumption due to bitline toggling during read operations.

Figure 2:
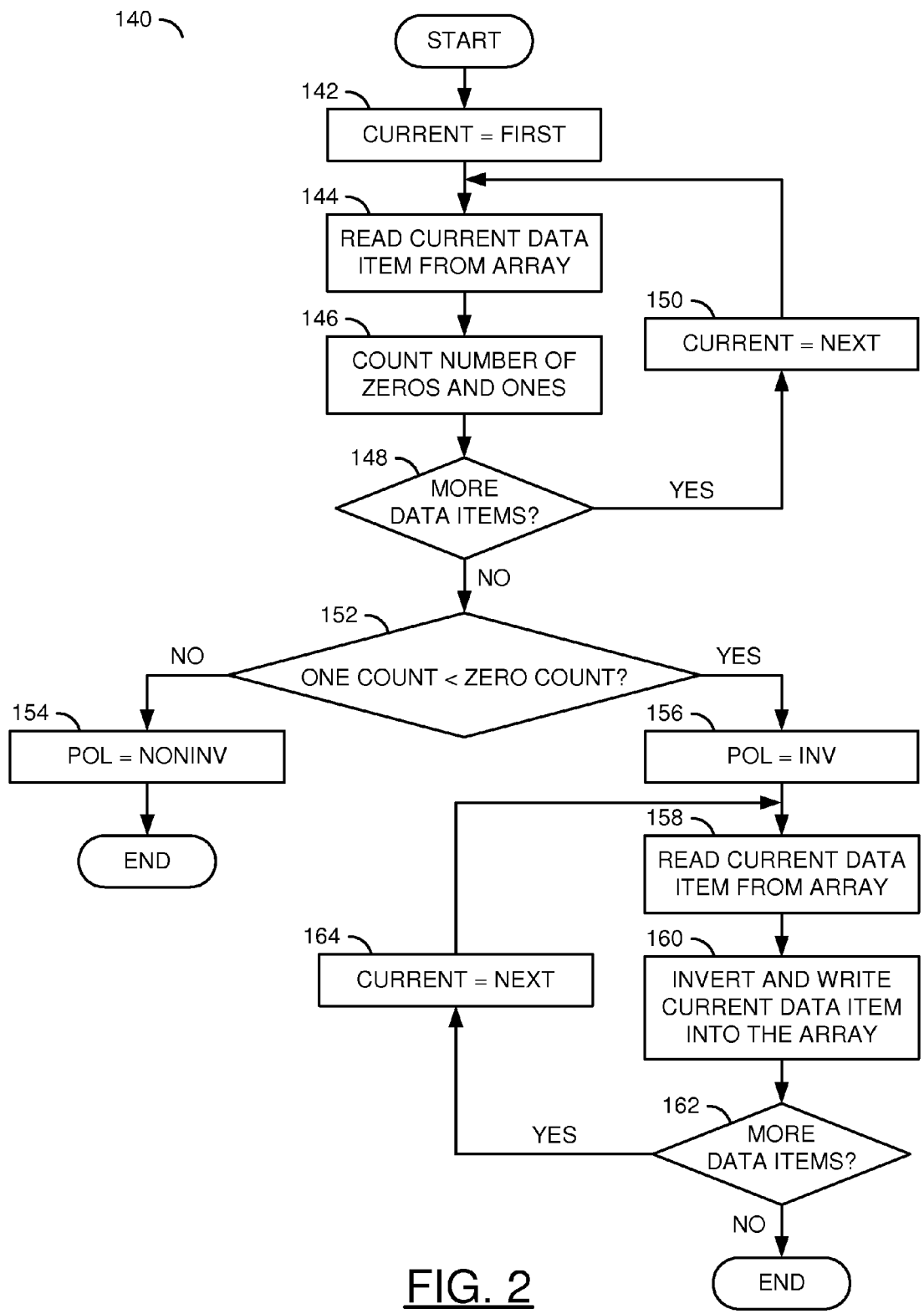
FIG. 2 is a flow diagram of a first example method to load data items into the device.

Referring to FIG. 2, a flow diagram of a first example method 140 to load data items is shown. The method (or process) 140 generally comprises a step (or block) 142, a step (or block) 144, a step (or block) 146, a step (or block) 148, a step (or block) 150, a step (or block) 152, a step (or block) 154, a step (or block) 156, a step (or block) 158, a step (or block) 160, a step (or block) 162 and a step (or block) 164. The method 140 may be implemented by the device 100a interacting with the data source 90.

In the step 142, the circuit 110 may begin an initial pass through the data items by initializing to a first address for the circuit 104. The initial pass may be triggered by (i) an assertion of the signal OPTIMIZE, (ii) an isolated change in one or more of the data items and/or (iii) a completion of a data set load from the data source 90.

A current data item stored at the current (first) address may be read from the circuit 104 to the circuit 110 in the step 144. The circuit 110 may count the number of bits in the current data item having the logical zero state and the number of bits in the current data item having the logical one state in the step 146. If more data items are available in the circuit 104 (e.g., the YES branch of step 148), the circuit may update the current address to the next (e.g., second) address in the step 150. Reading and counting may continue until all of the data items (as indicated by the signal MWA) have been checked. In some embodiments, the reading and counting may continue until all of the bit cells in the circuit 104 (including the unused bit cells) have been checked.

Upon completion of first scan (e.g., the NO branch of step 148), the circuit 110 generally compares the total number of logical zeros with the total number of logical ones just counted. If the logical zero count is not greater than the logical one count (e.g., the NO branch of step 152), the circuit 110 may set the signal POL to the non-inverting condition in step 154 and the method 140 may be ended. The data items as originally stored in the circuit 104 may be left alone (e.g., the data items may be in the normal condition as written).

If the logical zero count exceeds the logical one count (e.g., the YES branch of step 152), the circuit 110 may set the signal POL to the inverting condition in the step 156. Thereafter, the circuit 110 may begin a second pass through the data items to invert the normal state of each data item. In the step 158, a current (e.g., first) data item may be read from the circuit 104 to the circuit 110. The circuit 110 may invert the normal state of the current data item (e.g., logical one to logical zero or logical zero to logical one) then write the inverted data item back into the circuit 102 at the same address in the step 160. A check for the last data item is generally made after each write. If more data remains to be inverted (e.g., the YES branch of step 162), the circuit 110 may increment the current address to a next (e.g., second) address in the step 164. Processing of the data items may continue until all of the data items (or all of the bit cells) have been inverted. Once the second pass has completed (e.g., the NO branch of step 162), the method 140 may be ended.

Figure 3:
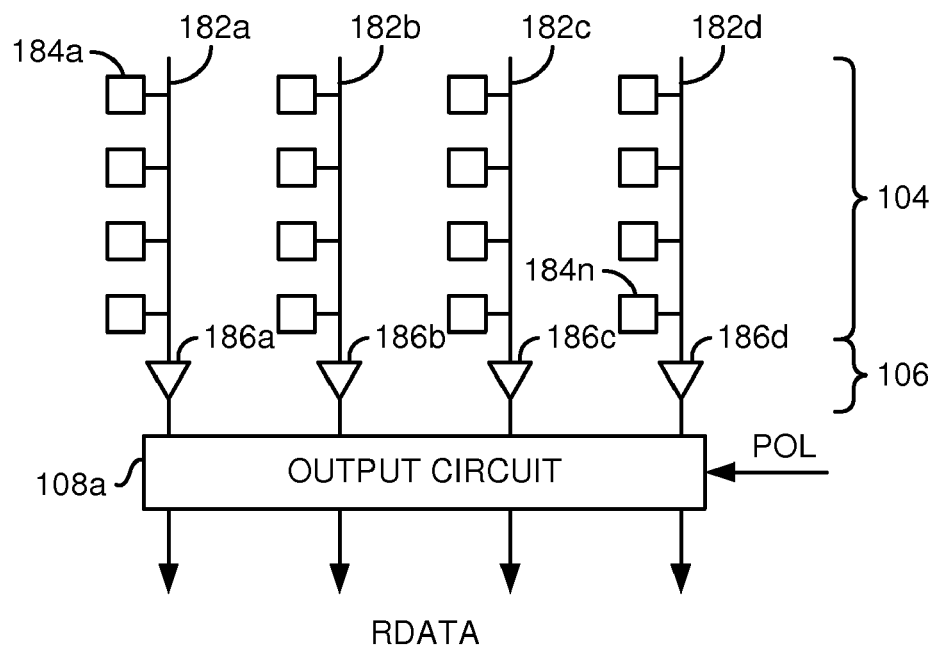
FIG. 3 is a detailed block diagram of a first example arrangement of an output circuit of the device.

Referring to FIG. 3 a detailed block diagram of a first example arrangement of an output circuit 108*a* is shown. The circuit 108*a* may be a variation of the circuit 108. The circuit 104 generally comprises multiple bitlines 182*a*-182*d* and multiple bit cells 184*a*-184*n*. A set of sense amplifiers 186*a*-186*d* in the circuit 106 may be connected at an end of the bitlines 182*a*-182*d*. The circuit 108*a* may be connected to the sense amplifiers 186*a*-186*d*. In the first arrangement, the circuit 104 may access data items as multi-bit (e.g., 4-bit) units. Furthermore, the circuit 108*a* may selectively invert/not invert all of the bits of each data item simultaneously based on the signal POL. If one bit of a data item is inverted, then all bits of all of the data items are inverted. The first arrangement may be useful in situations where the logical ones and the logical zeros are uniformly scattered across the data items from the most significant bits to the least significant bits.

Figure 4:
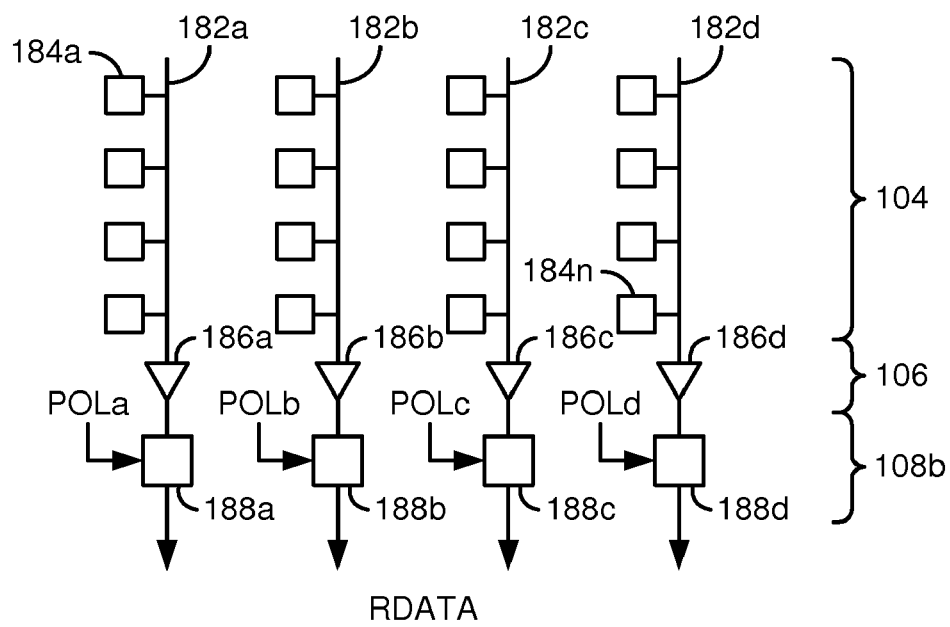
FIG. 4 is a detailed block diagram of a second example arrangement of the output circuit.

Referring to FIG. 4, a detailed block diagram of a second example arrangement of an output circuit 108*b* is shown. The circuit 108*b* may be a variation of the circuit 108. In the second arrangement, the data items may be accessed as either single-bit units or multi-bit units. The circuit 108*b* generally comprises multiple logic circuits 188*a*-188*d*. The signal POL may comprise multiple signals (e.g., POLa-POLd), one of the signals POLa-POLd for each respective logic circuit 188*a*-188*d*. Each of the logic circuits 188*a*-188*d* may be operational to invert/not invert a single bit in response to a respective signal POLa-POLd. In the second arrangement, some of the columns 182*a*-182*d* may store bits in the normal (original) state while other columns 182*a*-182*d* may store bits in an inverted state relative to the normal state. Furthermore, the method 140 may be adjusted to scan each of columns 182*a*-182*d* independently and then read-invert-write the individual columns where appropriate. The second arrangement may be useful in situations where one or more specific bit positions (e.g., the most significant bits) in some or all of data items have the same logical state. For example, 12-bit data items may be stored as 16-bit words with the upper 4 bits padded to logical zero. As such, the columns 182*a*-182*d* holding the upper 4 bits may be stored inverted (e.g., the logical one state) while the remaining lower 12 bits may be stored not inverted (e.g., a mixture of logical zero states and logical one states).

Figure 5:
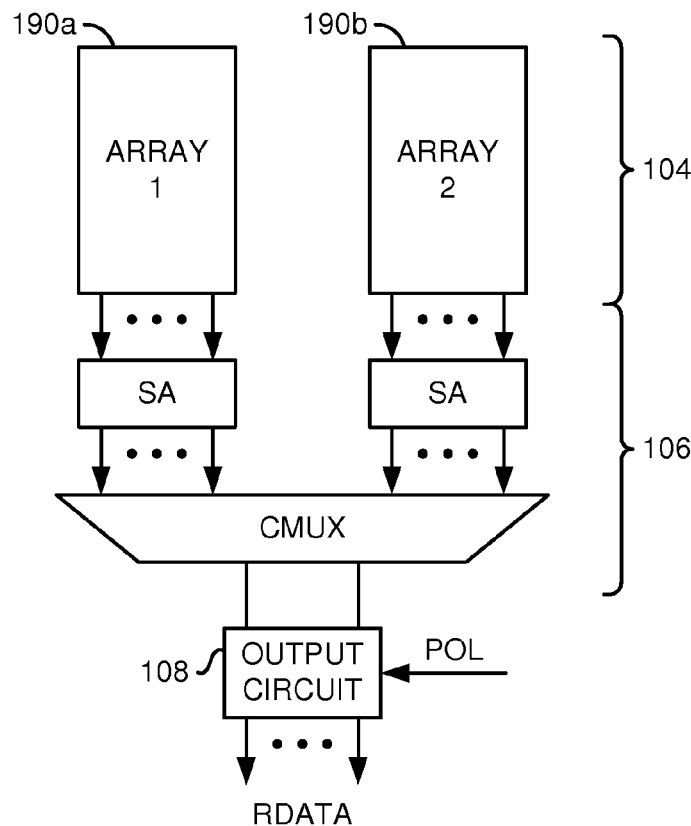
FIG. 5 is a detailed block diagram of an example arrangement of an array circuit of the device.

Referring to FIG. 5, a detailed block diagram of another example arrangement of the circuit 104 is shown. The circuit 104 may comprise multiple arrays (or modules) 190*a*-190*b* of bit cells. Each of the arrays 190*a*-190*b* may be configured as an independent block, page, region and/or set of the bit cells. The circuit 108 may be positioned after the column multiplexer such that the data items from each of the arrays 190*a*-190*b* are treated the same. If a data item from the array 190*a* is inverted by the circuit 108, then another data item from the array 190*b* may also be inverted.

Figure 6:
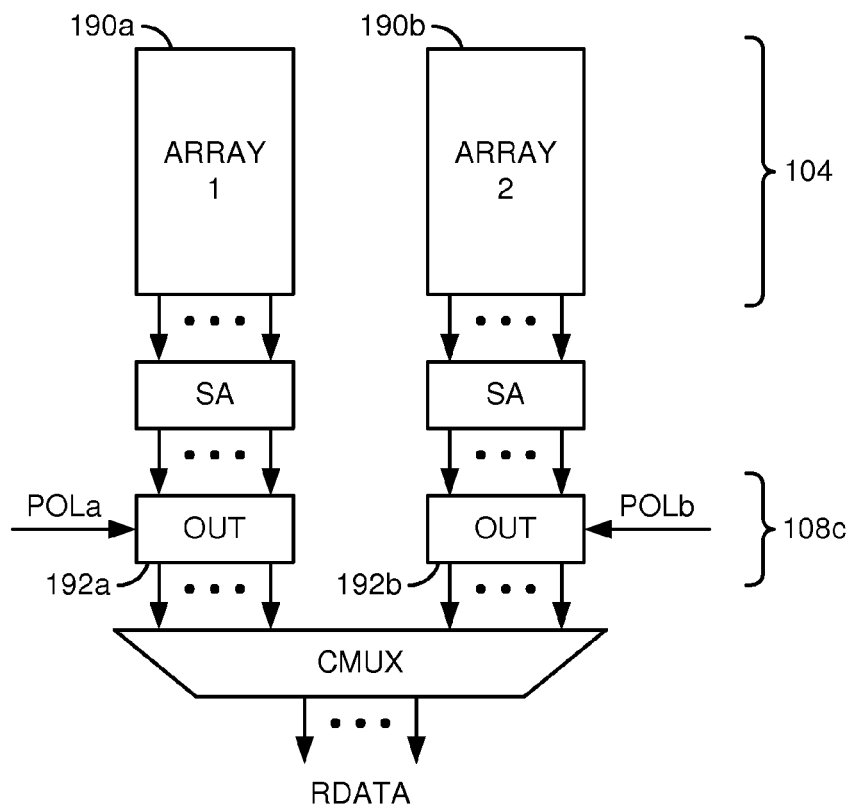
FIG. 6 is a detailed block diagram of a third example arrangement of the output circuit.

Referring to FIG. 6, a detailed block diagram of a third example arrangement of an output circuit 108*c* is shown. The circuit 108*c* may be a variation of the circuit 108*a*. The circuit 108*c* generally comprises multiple logic circuits (or modules) 192*a*-192*b*. The signal POL generally comprises multiple signals (e.g., POLa-POLb), one of the signals POLa-POLb for each respective logic circuit 192*a*-192*b*. Each of the arrays 190*a*-190*b* may be configured as an independent block, page, region and/or set of the bit cells. The circuits 192*a*-192*b* may be positioned between the sense amplifiers and the column multiplexer. As such, that data items in each array 190*a*-190*b* are inverted/not inverted independently of the data items is the other array 190*a*-190*b*. Independent inversion/non-inversion control for each of the arrays 190*a*-190*b* may be useful to shorten the time used to scan and possibly read-invert-write the data items. For example, while the circuit 90 is writing new data items into the array 190*b*, the circuit 110 may be simultaneously examining the data items previously stored in the array 190*a* to decide how to set the signal POLa. In another example, when one or more data items are changed in the array 190*a*, but none in the array 190*b*, the circuit 110 may examine only the array 190*a* to update only the signal POLa. No time may be spent looking at the data items in the array 190*b* as none were changed.

Figure 7:
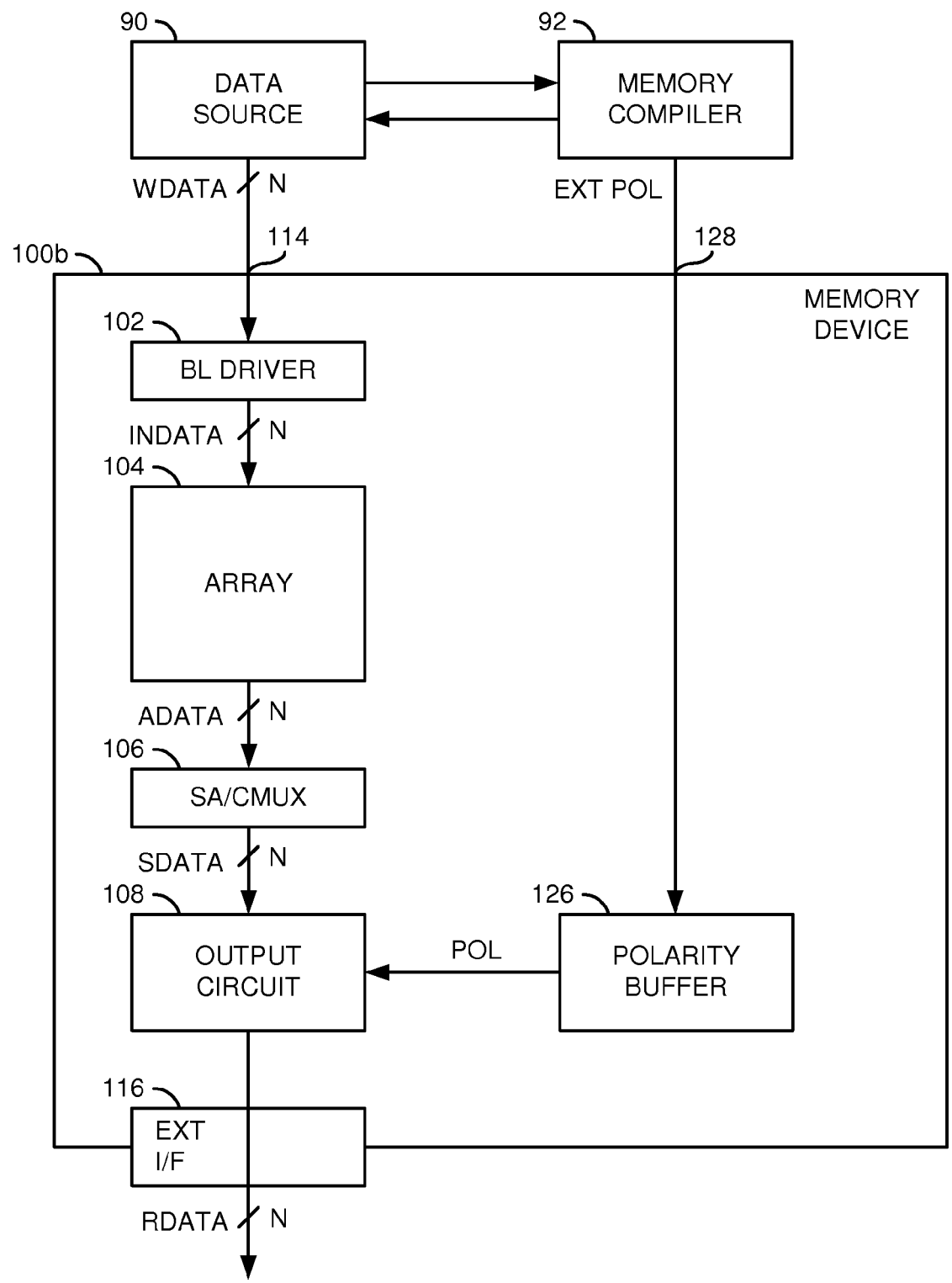
FIG. 7 is a block diagram of a second example implementation of the device.

Referring to FIG. 7, a block diagram of a second example implementation of a device 100*b* is shown. The device 100*b* may be a variation of the device 100*a*. A memory compiler 92 is illustrated as a source of an external polarity signal (e.g., EXTPOL) used by the device 100*b*. The device 100*b* generally comprises the circuit 102, the circuit 104, the circuit 106, the circuit 108 and a circuit (or module) 126. An interface 128 generally transfers the signal EXTPOL from the memory compiler 92 to the circuit 126. The circuit 126 may generate and present the signal POL to the circuit 108.

The circuit 126 may be implemented as a polarity signal buffer. The circuit 126 generally stores invert/non-invert information received from the compiler 92 via the signal EXTPOL. The invert/non-invert information programmed into the circuit 126 may be presented in the signal POL.

The compiler 92 is generally located outside the device 100*b*. The compiler 92 may be operational to determine if the data items transferred from the data source 90 to the device 100*b* are to be stored in the normal (non-inverted) condition or in the inverted condition to minimize the power consumption. A result of the decision is generally presented to the circuit 126 in the signal EXTPOL. As such, the circuit 126 may have a simple, small, low power design. The device 100*b* may be suited to memory technology where the bit cells within the circuit 104 can only be programmed once (e.g., mask programmable, fuse programmable, laser programmable and the like).

Figure 8:
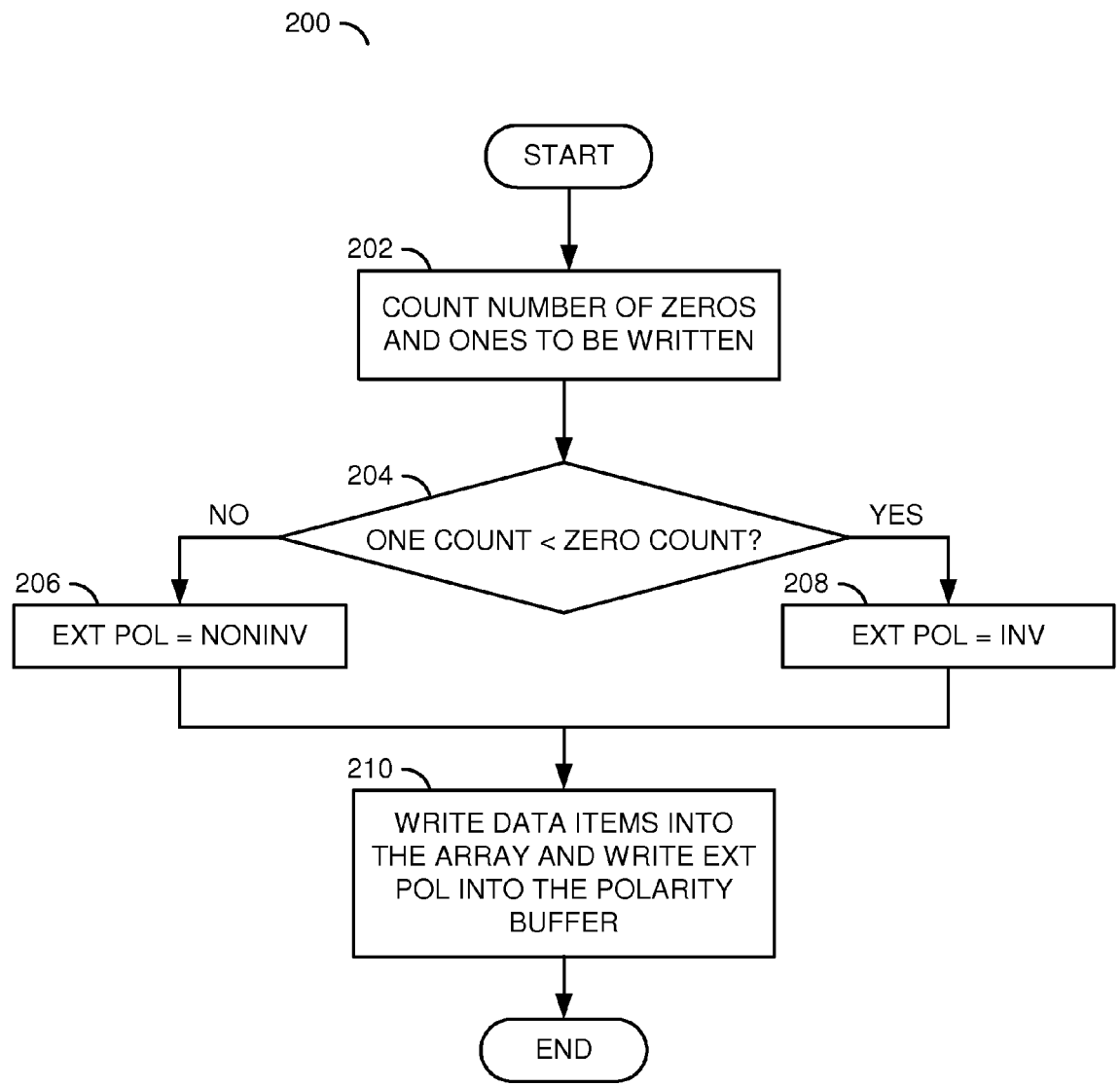
FIG. 8 is a flow diagram of a second example method of loading data items.

Referring to FIG. 8, a flow diagram of a second example method 200 of loading data items is shown. The method (or process) 200 generally comprises a step (or block) 202, a step (or block) 204, a step (or block) 206, a step (or block) 208 and a step (or block) 210. The method 200 may be implemented by the compiler 92 interacting with the data source 90 and the device 100*b*.

In the step 202, the compiler 92 may count the number of logical one bits and the number of logical zero bits in a data set held by the data source 90. In the step 204, the compiler 92 may check the logical one count against the logical zero count. If the logical zero count is not greater than the logical one count (e.g., the NO branch of the step 204), the compiler 92 may generate the signal EXTPOL in the non-inverting condition in the step 206. If the logical zero count is greater than the logical one count (e.g., the YES branch of step 204), the compiler 92 may generate the signal EXTPOL in the inverting condition in the step 208. The data source 90 may use the status of the signal EXTPOL to transfer either (i) the normal data set or (ii) an inverted data set to the device 100*b* in the step 210. The device 100*b* may store the received data set (data items) in the circuit 104 and store the condition of the signal EXTPOL in the circuit 126. Thereafter, the circuit 108 may present the data items at the interface 116 in the normal state by inverting/not inverting the data items read form the circuit 104 based on the inverting/non-inverting condition of the signal POL.

Figure 9:
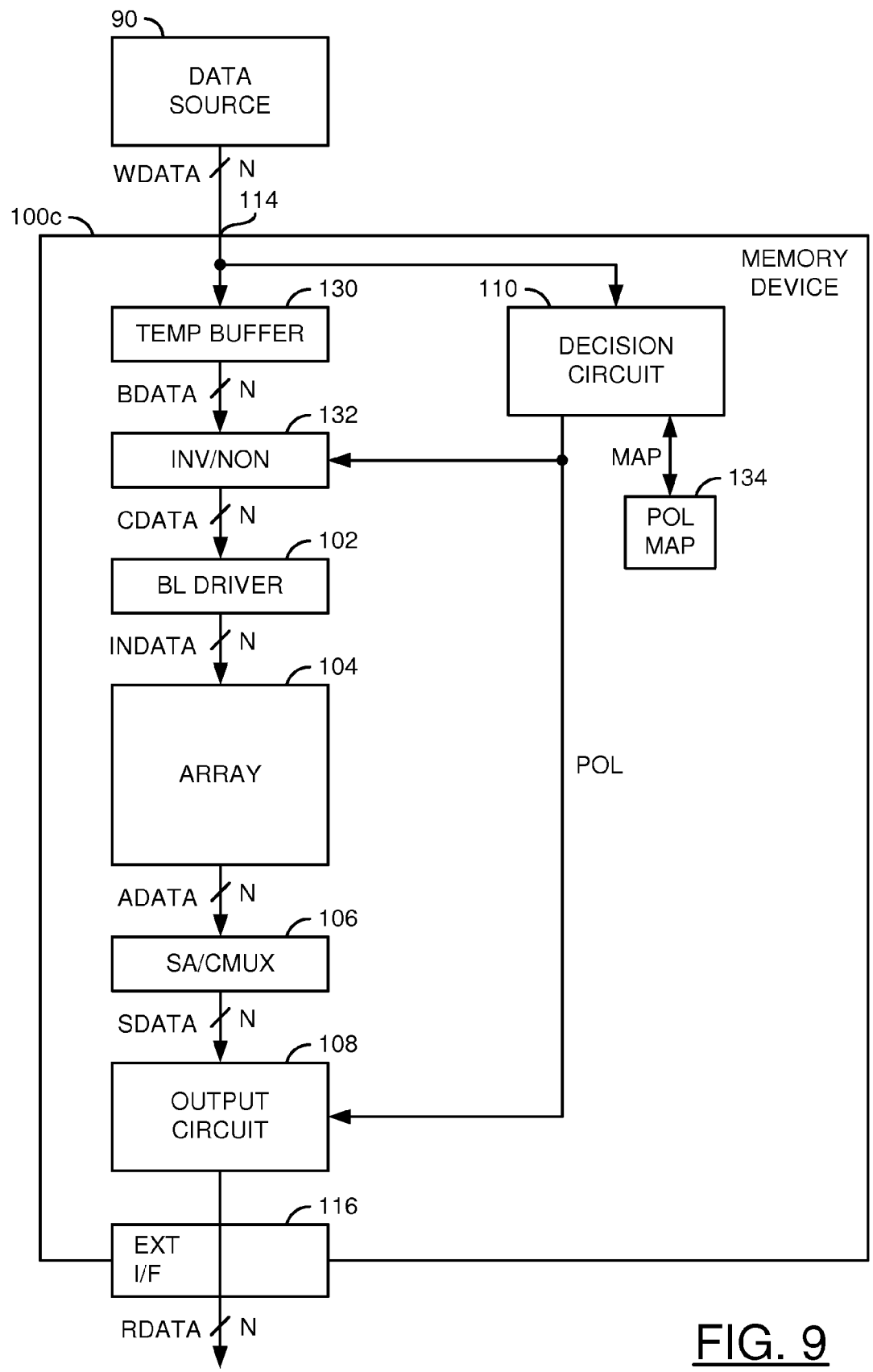
FIG. 9 is a block diagram of a third example implementation of the device.

Referring to FIG. 9, a block diagram of a third example implementation of a device 100*c* is shown. The device 100*c* may be a variation of the device 100*a*. The device 100*c* generally comprises the circuit 102, the circuit 104, the circuit 106, the circuit 108, the circuit 110, a circuit (or module) 130, a circuit (or module) 132 and a circuit (or module) 134. The circuit 130 may receive the signal WDATA from the data source 90 through the interface 114. A signal (e.g., BDATA) may be generated and presented from the circuit 130 to the circuit 132. The circuit 132 may generate and present a signal (e.g., CDATA) to the circuit 102. The signal POL may be presented from the circuit 110 to both the circuit 108 and the circuit 132. A signal (e.g., MAP) may be exchanged between the circuit 110 and the circuit 134.

The circuit 130 may be implemented as a buffer circuit. The circuit 130 is generally operational to temporarily buffer N columns of write data. The buffered data may be presented to the circuit 132 in the signal BDATA.

The circuit 132 may be implemented as a logic circuit. The circuit 132 may be a copy of the circuit 108. Operationally, the circuit 132 may selectively invert/not invert the data items in the signal BDATA to create the signal CDATA based on the condition of the signal POL.

The circuit 134 may implement a polarity map buffer. The circuit 134 may be programmed by the circuit 110 to store a map of polarity values for multiple regions of bit cells within the circuit 104. Each of the regions may be similar in size to the capacity of the circuit 130. The device 100*c* may be useful with both (i) memory technologies where the bit cells may be written only once and (ii) memory technologies where the bit cells may be written to many times.

Figure 10:
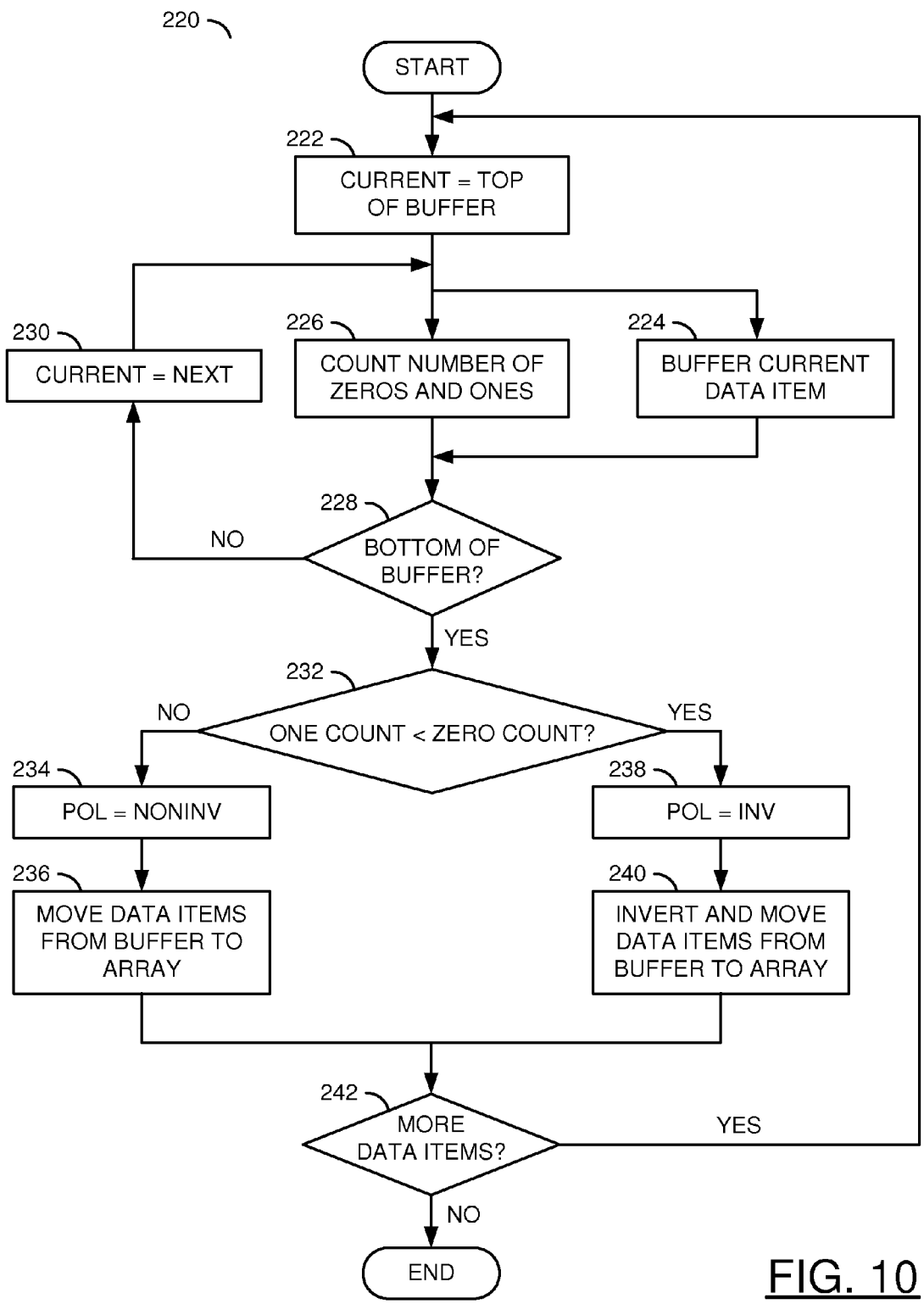
FIG. 10 is a flow diagram of a third example method of loading data items.

Referring to FIG. 10, a flow diagram of a third example method 220 of loading data items is shown. The method (or process) 220 generally comprises a step (or block) 222, a step (or block) 224, a step (or block) 226, a step (or block) 228, a step (or block) 230, a step (or block) 232, a step (or block) 234, a step (or block) 236, a step (or block) 238, a step (or block) 240 and a step (or block) 242. The method 220 may be implemented by the device 100*c* interacting with the data source 90.

In the step 222, the circuit 110 may initialize a buffer address to a top of the circuit 130. A first group of normal data items may be transferred, one at a time, from the data source 90 into the circuit 130 via the signal WDATA in the step 224. As a current data item is written into the circuit 130, the circuit 110 may count the number of logical zero bits and the number of logical one bits in the step 226. A check may be performed by the circuit 110 in the step 228 to determine if the bottom of the circuit 130 has been reached. If the circuit 130 is not full (e.g., the NO branch of step 228), the circuit 110 may increment the address in the step 230. A new current data item (e.g., second data item) may then be transferred from the data source 90 to the device 110*c*. The cycle may be repeated until the buffer becomes full.

When the buffer has been filled (e.g., the YES branch of step 228), the circuit 110 may examine the logical zero count and the logical one count. If the logical zero count is not greater than the logical one count (e.g., the NO branch of step 232), the circuit 110 may set the signal POL to the non-inverting condition and record the decision in the circuit 134 as part of the step 234. With the signal POL commanding no inversion, the circuit 132 may transfer the data items from the circuit 130 to the circuit 104 as-is in the step 236. If the logical zero count is greater than the logical one count (e.g., the YES branch of step 232), the circuit 110 may generate the signal POL in the inverting condition and record the decision in the circuit 134 as part of the step 238. Thereafter, the circuit 132 may invert the data items during a move from the circuit 130 to the circuit 104 in the step 240.

If more data is available from the data source 90 (e.g., the YES branch of step 242), the circuit 110 may clear the counters and reset the buffer address to the top of the buffer in the step 222. The process may be repeated until all of the data items have been moved to the circuit 130 and then moved to the circuit 104. Once all of the data items have been stored in the circuit 104 (e.g., the NO branch of step 242), the method 220 may be ended.

The method 220 generally creates multiple polarity values for multiple sets of data items, similar to the arrangement of FIG. 6. However, in the device 100*c*, a single signal POL may be used to pass the different polarity values to the circuit 108 depending on which set of data items is being read. The circuit 134 generally contains a map of which sets are to be inverted and which sets are not to be inverted.

The data inversion/non-inversion functions generally take place after the sensing operation and usually after the column decoding such that the amount of toggling due to the inversion is minimized (e.g., in a 16:1 column multiplexer, only 1 out of every 16 columns read would be inverted after being sensed). Some sensing schemes may incorporate the inversion capability within the sense amplifiers without any timing impact. Some sense amplifiers may have both a true output and a complimentary output. As such, a selection function of either the true output or the complimentary output may be placed between the sense amplifiers and the column multiplexers. For circuit 104 implementing self time sensing schemes, the data inversion/non-inversion functions may be performed after column multiplexing and prior to the sense amplifiers. Since the data inversion/non-inversion operations may be part of the self-timing path, such implementations may have no impact on the self-timing.

In some memory technologies, the data items are loaded into the circuit 104 during fabrication of the devices (e.g., 100b). For example, the data may be mask programmable or laser programmable. Therefore, inclusion/absence of the inverters 120 may be settled before fabrication of the device has finished. As such, the circuit 110 and the circuit 126 may be absent from the design. In the event that the inclusion/absence of the inverters 120 is outside of the sensing schemes such that the effect is directly translated into memory characterization data, the memory performance characterization may take into account the presence/absence of the inverters 120.

The actual incorporation/exclusion of the inverters 120 or non-inverting paths 122 may be a last minute mask programmable option dependent on the data set. The data set dependent impact on timing may easily be taken care of by characterizing the output data hold time with the inverter missing (e.g., previous data item reads disappears as soon as possible with no inverter delay holding the data items longer). The memory access time may be calculated with the inverters 120 in place, generally pushing out an access time.

The present invention may minimize power consumption for memory devices based upon the data set being programmed. The modifications to (i) the data items within the data set and (ii) the signal POL to minimize the power consumption may be done any time the code is updated. For one-time programmable devices, such as mask programmable ROMS, the choice of including the inverters 120 and flipping all the ROM array data or including the non-inverting paths 122 may be easily accounted for in a last memory build prior to a tapeout.

The function performed by the diagrams of FIGS. 1-10 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method for conserving power in a device, comprising the steps of:
   (A) receiving a plurality of data items in a normal condition;
   (B) storing said data items as received in a plurality of bit cells in said device in a first pass operation, wherein reading one of said bit cells having a first logic state consumes less power than reading one of said bit cells having a second logic state;
   (C) generating a polarity signal internal to said device by analyzing said data items during a second pass operation through said bit cells, said polarity signal indicating that a majority of bits of said data items are stored in one of (i) said first logic state and (ii) said second logic state;
   (D) reading-inverting-writing said bits during a third pass operation through said bit cells in response to said majority of said bits having said second state; and
   (E) driving at least one of said data items onto an external interface of said device in said normal condition during a read operation based on said polarity signal.

2. The method according to claim 1, wherein (i) said bit cells are configured as a plurality of columns, (ii) said polarity signal comprises a plurality of polarity signals, each of said polarity signals corresponding to a respective one of said columns, (iii) said analyzing is performed on a column-by-column basis among all of said bits within each of said columns, (iv) said reading-inverting-writing is performed within each of said columns based on said respective analysis and (v) said driving of said at least one data item is based on said polarity signals corresponding to said columns involved in said read operation.

3. The method according to claim 1, wherein (i) said bit cells are configured as a plurality of arrays, (ii) said polarity signal comprises a plurality polarity signals, each of said polarity signals corresponding to a respective one of said arrays, (iii) said analyzing is preformed on an array-by-array basis among all of said bits within each of said arrays, (iv) said reading-inverting-writing is performed within each of said arrays based on said respective analysis and (v) said driving of said at least one data item is based on said polarity signals corresponding to said arrays involved with said read operation.

4. The method according to claim 1, further comprising the step of:
   initiating said analyzing upon receipt of an optimization command at said device from a source external to said device.

5. The method according to claim 1, wherein said analyzing comprises the sub-steps of:
   generating a first count by counting said bits in said first logic state; and
   generating a second count by counting said bits in said second logic state.

6. The method according to claim 5, further comprising the step of:
   updating at least one of said first count and said second count in response to a change in at least one of said bits after said second pass has completed.

7. The method according to claim 6, further comprising the step of:
   repeating said reading-inverting-writing in response to said second count exceeding said first count after said updating.

8. The method according to claim 1, further comprising the step of:
   storing a maximum write address that identifies a boundary between said data items and an unused group of said bit cells, wherein said analysis excludes said unused group of said bit cells.

9. A device comprising:
   a plurality of bit cells configured to (i) receive a plurality of data items in a normal condition and (ii) store said data items as received in a first pass operation, wherein reading one of said bit cells having a first logic state consumes less power than reading one of said bit cells having a second logic state;

a decision circuit configured to (A) generate a polarity signal by analyzing said data items during a second pass operation through said bit cells, said polarity signal indicating that a majority of bits of said data items are stored in one of (i) said first logic state and (ii) said second logic state and (B) read-invert-write said data items during a third pass operation through said bit cells in response to said majority of said data items having said second state; and an output circuit configured to drive at least one of said data items onto an external interface of said device in said normal condition during a read operation based on said polarity signal.

10. The device according to claim 9, wherein said first logic state comprises a pre-charge voltage of a plurality of bit lines used to read said bit cells.

11. The device according to claim 9, wherein (i) said bit cells are configured as a plurality of columns, (ii) said polarity signal comprises a plurality of polarity signals, each of said polarity signals corresponding to a respective one of said columns, (iii) said decision circuit generates a plurality of said polarity signals by analyzing on a column-by-column basis all of said bits within each of said columns, (iv) said decision circuit reads-inverts-writes within each of said columns based on said respective analysis and (v) said output circuit drives said at least one data item based on said polarity signals corresponding to said columns involved in said read operation.

12. The device according to claim 9, wherein (i) said bit cells are configured as a plurality of arrays, (ii) said polarity signal comprises a plurality of polarity signals, each of said polarity signals corresponding to a respective one of said arrays, (iii) said decision circuit generates said polarity signals by analyzing on an array-by-array basis all of said bits within each of said arrays, (iv) said decision circuit reads-inverts-writes within each of said arrays based on said respective analysis and (v) said output circuit drives said at least one data item based on said polarity signals corresponding to said arrays involved with said read operation.

13. The device according to claim 9, wherein said bit cells comprise nonvolatile bit cells.

14. The device according to claim 9, further comprising a register configured to store a maximum write address that identifies a boundary between said data items and an unused group of said bit cells, wherein said analysis excludes said unused group of said bit cells.

15. The device according to claim 9, wherein said decision circuit is further configured to generate (i) a first count by counting said bits in said first logic state and (ii) a second count by counting said bits in said second logic state.

16. The device according to claim 15, wherein said decision circuit is further configured to update at least one of said first count and said second count in response to a change in at least one of said bits after said second pass has completed.

17. The device according to claim 16, wherein said decision circuit is further configured to repeat said reading-inverting-writing in response to said second count exceeding said first count after said updating.

18. A device comprising:

a memory array configured to store a first set of data items in a normal condition, each of said data items (i) comprising a plurality of bits and (ii) corresponding to a respective one of a plurality of addresses;

a logic circuit configured to selectively (i) invert said bits and (ii) not invert said bits as received from said memory array in response to a polarity signal;

a plurality of bit cells configured to store said bits as received from said logic circuit, wherein reading one of said bit cells having a first logic state consumes less power than reading one of said bit cells having a second logic state;

a decision circuit configured to (A) generate a first polarity value by analyzing said first set of said data items as stored in said memory array and (B) present said first polarity value in said polarity signal, said first polarity value indicating that a majority of said bits in said first set are in one of (i) said first logic state and (ii) said second logic state; and an output circuit configured to drive at least one of said data items onto an external interface of said device in said normal condition during a read operation based on said polarity signal.

19. The device according to claim 18, wherein said bit cells comprises a plurality of one-time electronically programmable bit cells.

20. The device according to claim 18, wherein (i) said memory array is further configured to store a second set of data items in said normal condition after said first set has been transferred to said bit cells and (ii) said decision circuit is further configured to (a) generate a second polarity value by analyzing said second set of said data items as stored in said memory array and (b) present said polarity value in said polarity signal to said logic circuit.

* * * * *